United States Patent [19]

Meyer et al.

[11] 4,197,631

[45] Apr. 15, 1980

[54] METHOD OF MANUFACTURING SEMICONDUCTOR COMPONENTS

[75] Inventors: Eckhard Meyer, Lampertheim; Günter Berndes, Heppenheim, both of Fed. Rep. of Germany

[73] Assignee: BBC Brown Boveri & Company, Limited, Baden, Switzerland

[21] Appl. No.: 857,860

[22] Filed: Dec. 6, 1977

[30] Foreign Application Priority Data

Dec. 10, 1976 [DE] Fed. Rep. of Germany ....... 2656015

[51] Int. Cl.² ............................................. B01J 17/00
[52] U.S. Cl. ...................................... 29/574; 29/580; 29/583; 29/589
[58] Field of Search ................. 29/580, 583, 574, 589; 357/49

[56] References Cited

U.S. PATENT DOCUMENTS

| | | | |
|---|---|---|---|
| 2,959,502 | 11/1960 | Gaertner | 29/580 |
| 3,159,780 | 12/1964 | Parks | 357/49 |
| 3,389,457 | 6/1968 | Goldman | 29/580 |
| 3,669,773 | 6/1972 | Levi | 29/580 |
| 3,795,045 | 3/1974 | Dumas | 29/580 |
| 3,852,876 | 12/1974 | Sheldon | 29/580 |

*Primary Examiner*—W. C. Tupman
*Attorney, Agent, or Firm*—Oblon, Fisher, Spivak, McClelland & Maier

[57] ABSTRACT

A method of fabricating semiconductor components having electrodes and terminals. The method includes preparing an undivided semiconductor wafer having at least one pn-junction; etching a grid pattern of grooves into at least one side of the undivided wafer, thereby forming mesas with concave side surfaces and elevations with upper surfaces bounded by closed rounded curves; coating the exposed lateral surfaces of the etched mesas with a passivating layer; metallizing the upper surfaces of these elevations, thereby providing ohmic contacts for the undivided semiconductor wafer; and breaking the undivided semiconductor wafer into individual semiconductor chips along the lines of the etched grooves.

8 Claims, 6 Drawing Figures

METHOD OF MANUFACTURING SEMICONDUCTOR COMPONENTS

BACKGROUND OF THE INVENTION

1. Field of the Invention

The invention relates to a method of fabricating semiconductor components with electrodes and terminals in which a silicon semiconductor wafer with at least one pn-junction is first prepared. Thereafter, at least one side of the wafer is etched with a grid pattern to cut grooves penetrating through the pn-junction, thereby forming mesas with concave lateral surfaces. The exposed lateral surfaces of the mesas are then provided with passivating coatings and the wafer is split along the grooves.

The method is particularly, but not exclusively, suited to the production of thyristors with central gates, as are known from DT-PS No. 1,132,247 for example.

2. Description of the Prior art

In a known method of the type discussed above, the etching process for producing the mesas leads naturally to concave lateral surfaces, the upper edges of the grooves being separately etched in order to produce a convex portion on the lateral surfaces of each mesa structure at the point of emergence of the pn-junction at the surface (DT-OS No. 2,536,108). These measures serve advantageously to raise the inverse breakdown voltage and desirably to produce negative chamfering of the individual component, i.e., for slices parallel to the pn-junction or the wafer face there is a decrease in cross section towards the zones of lower resistivity or the more strongly doped zones (cf. also the definition in DT-AS No. 1,281,584). In the known case (DT-OS No. 2,536,108) the individual elements after further treatment, e.g. glass passivation of the exposed mesa surfaces, are detached by cutting them apart or by etching away the other side of the wafer. The individual semiconductor chips which are to be made into semiconductor components with electrodes and terminals, must then separately and sequentially, i.e. one after another in serial production, undergo the necessary contacting processes, such as metallization to make solderable ohmic contacts, and terminal soldering. In addition, in the prior art, the rounding of the mesa edges is insufficient, resulting in an angular boundary or a merely rounded corner at the intersections of the grooves.

SUMMARY OF THE INVENTION

Accordingly, one object of the present invention is to provide a novel method for economically mass producing semiconductor components.

Another object of the present invention is to provide a novel method of mass producing semi-conductor devices having good electrical properties.

A further object of this invention is to provide a novel method of producing semiconductor devices having a high breakdown voltage.

These and other objects of this invention are achieved by etching semiconductor wafers to form elevations with their upper surfaces bounded by closed rounded curves and to carry out the contacting of the electrodes and terminals on the undivided wafer. Preferably the elevations are made with circular upper surfaces. Such an etching pattern gives rise to mesa structures which are bounded in the regions of critical field strengths by rounded curves or adjoining concave lateral surfaces with a negative chamfering angle.

To fabricate thyristors, i.e. starting with a semiconductor wafer with at least four zones of alternating and different conductivity types, the grooves are etched in grid patterns over both sides, penetrating the pn-junction intended for the blocking junction.

Preferably, after a metallizing process for producing solderable ohmic contacts, disks of a electrically and thermally conducting material tinned on at least one side are placed in a first template matched to the grid pattern of the wafer, the wafer is laid on the template. Thereafter, a second template with preforated disks of electrically and thermally conducting material, tinned on at least one side and arranged to match the grid pattern of the wafer can be laid on the other side of the wafer. All the disks are then simultaneously soldered to the top surfaces, parallel to the wafer plane, of the elevations. Molybdenum disks and a lead-silver or a lead-tin solder are preferred for this application. The metallization and the sandwich technique for applying the metal disks as terminals to the undivided wafer shorten the fabrication time considerably, since in contrast to the known method discussed above, production proceeds more on a mass production basis.

In order to avoid needless loss of relatively expensive molybdenum disks during mass production, it is advisable to measure the inverse voltage rating of the semiconductor chips before application of the disks. The locations of defective elements are electronically detected and stored in memory. The corresponding positions on the template remain free of disks. Furthermore, the control terminals for the semiconductor components are preferably soldered simultaneously with the disks.

After the separation of the elements of the wafter along the grooves, and subsequent to the contacting process, the individual semiconductor chips are embedded in plastic in such a way that the perforated disks on one side and the other disks on the other side protrude somewhat from the plastic.

Alternatively, two semiconductor components like thyristors can also be put into a common plastic casing. In this case, the corresponding disks of the cathode of one thyristor and the anode of other are connected to one another, as for example by a thin conductive foil, and the control terminals as well as the unconnected main terminals are brought out, separately. Such a module is then hermetically encapsulated in plastic and distinguishes itself as the end product of the method of the invention by its reliability under conditions of high voltage and humidity. Accordingly, it can serve, for example, as the arm of a two-phase bridge circuit.

In order to increase voltage reliability, it is advisable to use disks of smaller diameter than that of the faces of the semiconductor chips. This measure, as such, is known (DT-OS No. 2,400,863) and serves to separate the proximate pn-junction in the region of the mesa edge from critical solder points.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
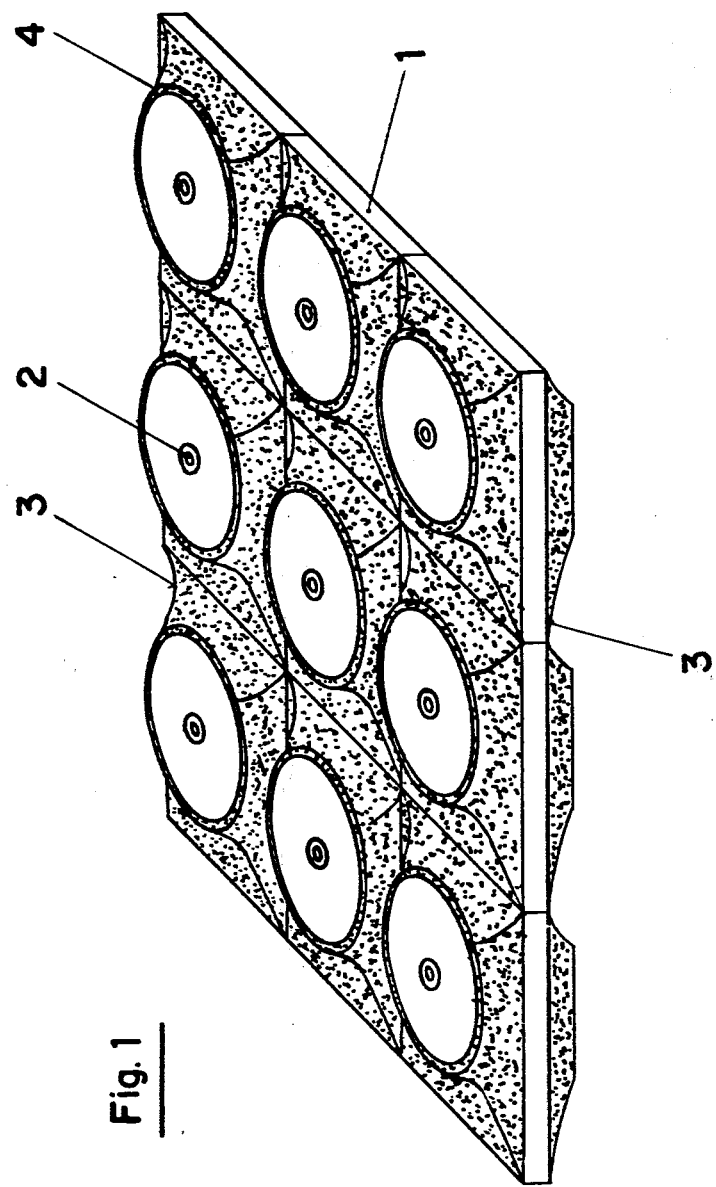
FIG. 1 is a view of a semiconductor wafer with glass-passivated grooves on both sides.

Referring now to the drawings, wherein like reference numerals designate like or corresponding parts throughout the several views, and more particularly to FIG. 1 thereof, there is seen a silicon wafer 1 which, before the usual process steps like purification, is subjected to multiple oxidation and diffusion processes, etching and washing processes, as well as a getter process if need be.

This wafer 1 is now covered in places corresponding to the desired lattice pattern, by masks or photolack films (photo-resist technqiues). The covering is on circular surfaces on both sides of the wafer, with the control zone 2 of each under the center of the covering. In the subsequent etching process, by means of hydrofluoric acid for instance, the grooves 3 are formed to such a depth that the blocking pn-junctions are cut through in a self-evident manner.

The bottoms and sides of the grooves are then coated with a passivating layer or layers, thus stabilizing the electrical properties of the semiconductor components. Various well-known glasses, such as phosphor silicate glasses, boron silicate glasses, lead-aluminum silicate glasses, zinc-boron silicate glasses silicon dioxide, silicon nitride, silicon oxide-nitride, etc. can be used for the passivating coating. The passivating layers can be applied by the chemical vapor deposition method (CVD method—e.g. IEEE Transactions on Electron Devices Vol. ED-17, No. 9, September, 1970, pp 797-799) or by means of electrophoresis or coating with an emulsion.

After passivation, the surface areas of the individual elements on the still undivided wafer 1, which are to be provided with solderable ohmic contacts, are subjected to a metallizing process. Here again several layers can be applied in the metallization or electrode buildup process. For example gold and soft solder layers can be applied over a single or double nickel layer, or a layer sequence of a nickel layer, a copper layer and a gold layer plus a suitable layer of soft solder can be provided. Satisfactory layers can also be formed by evaporation or cathode sputtering.

Figure 2:
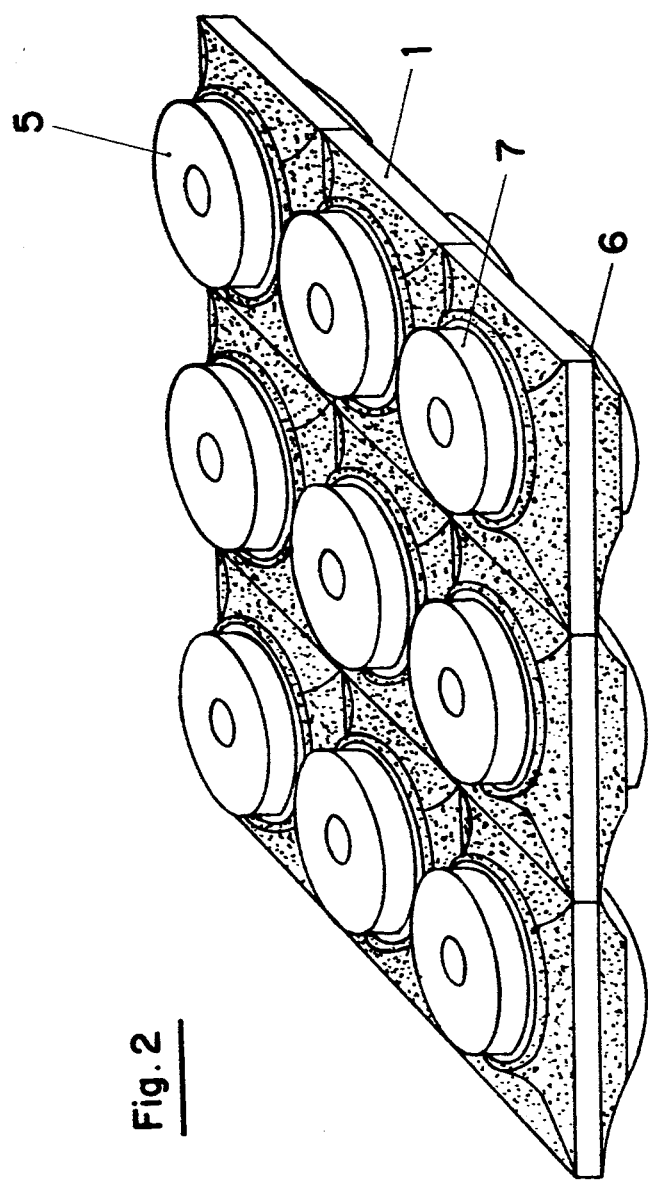
FIG. 2 is a view of the semiconductor wafer of FIG. 1 with disks soldered to it.

Following this production of solderable ohmic electrodes, the disks are likewise applied to the undivided wafer (FIG. 2). The anodic faces of the semiconductor chips receive unperforated disks 6 and the emitter or cathodic faces receive perforated ones 7. Circular molybdenum disks 6 and 7, preferably tinned on at least one side with lead-silver or lead-tin solder, are used in the process. The disks 6 are held on a template, the wafer 1 is then laid on the template. The disks 7 are held on another template and are in turn laid on the wafer. The geometry of the templates is matched to the grid pattern on the wafer so that the disks 6 and 7 can be applied simultaneously, with a minimum of alignment effort, to the appropriate electrode surfaces. Likewise all the disks 6 and 7 are soldered to the corresponding electrodes simultaneously. This can be done in a continuous soldering oven for example.

As discussed above, the inverse voltage rating of the semiconductor chips can be measured before application of the disks 6 and 7.

Figure 3:
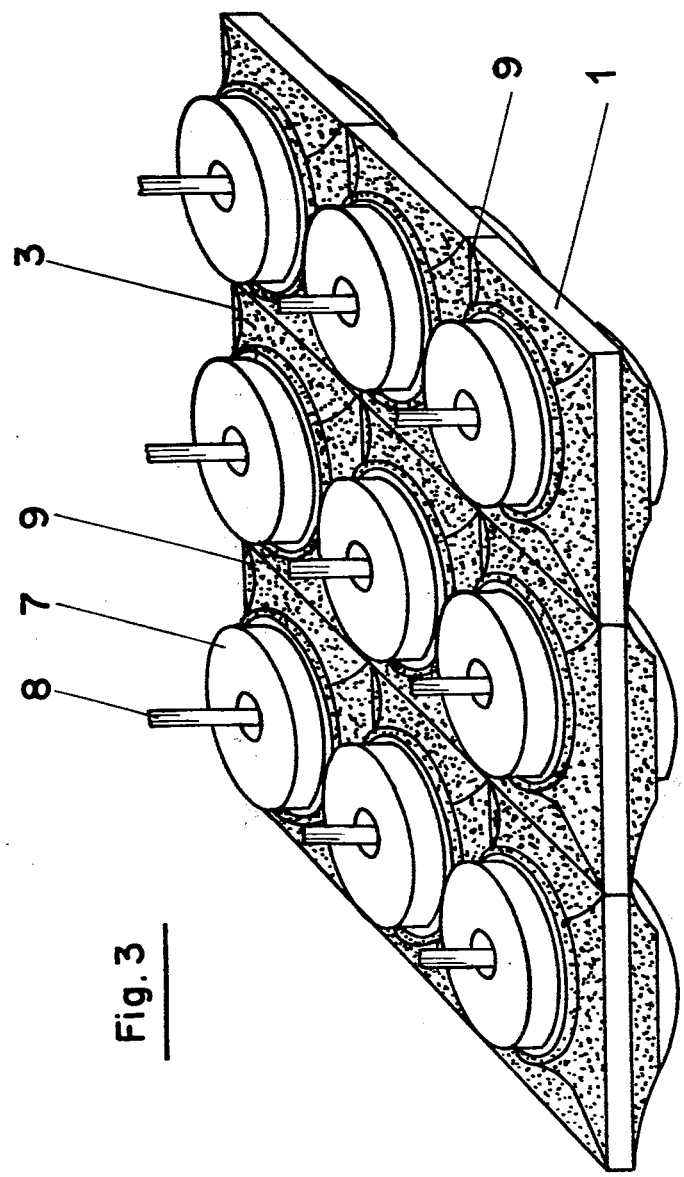
FIG. 3 is a view of the semiconductor wafer of FIG. 1 with central control terminals.

It is advantageous to solder on the control terminals 8 for the semiconductor components simultaneously with the soldering of the disks 6 and 7 (FIG. 3). This step can, of course, be separated from the soldering of the disks 6 and 7; but, in any case, it is carried out on the undivided wafer 1. The control leads 8 are attached by known techniques, e.g. by ultrasonic bonding or by application of the control lead 8 with a drop of solder on its tip.

Finally, the wafer 1 is partially cut by a standard method such as laser beam, sand jet or diamond saw, and then broken along the lines 9 of the cuts.

Figure 5:
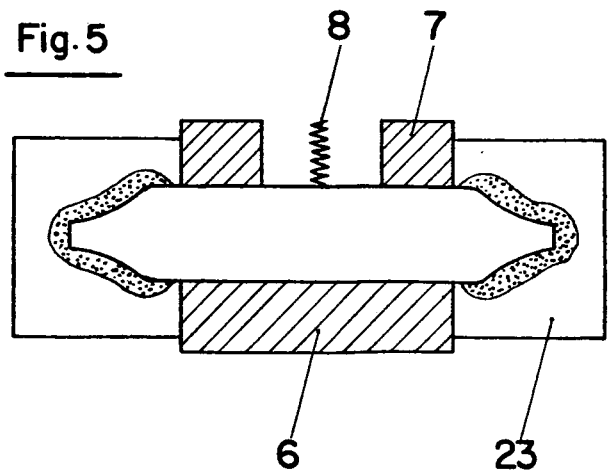
FIG. 5 is a view of a semiconductor component in a plastic casing and FIG. 6 is a view of an example of an application of the semiconductor components of FIG. 4.
Figure 4:
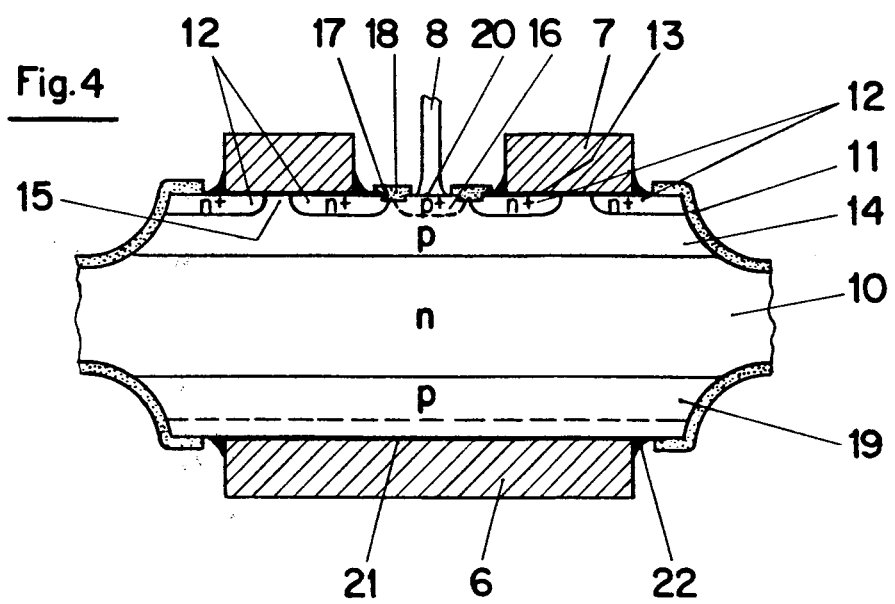
FIG. 4 is a cross-sectional view through a single semiconductor component of the wafer of FIG. 1.

From the cross-sectional view of a single semiconductor component, shown in FIG. 4, the thyristor structure of at least four zones of alternating conductivity types, as well as the groove depth, is visible. The groove extends down into the central n-conducting zone 10. The passivating layer 11 is broken at the edge of the component. This edge is later provided with a ductile coating (ct. FIG. 5). Between the $n^+$-conducting emitter zone 12 and the perforated molybdenum disk 7 is the metallization or electrode 13 with the structure described above. The zone 14 lying beneath the emitter zone 12 extends up throuugh the latter in places (emitter short circuits 15). It is seen that an inner emitter ring surface next to the control terminal is not contacted. A control zone 16 is bounded by a gate channel 17 to which another passivating layer 18 is applied. Like the emitter zone 12, the control zone 16 and an anode zone 19 are provided with metallizations 20 or electrodes 21 on their surfaces. Finally, it is seen that the disks 6 and 7 have solder fillets 22 around them.

After complete passivation of the semiconductor element of FIG. 4, the element can be encapsulated in plastic (FIG. 5). The disks 6 and 7 protrude slightly from the plastic casing. For the control terminal 8 there can also be provided in a known way a spring contact situated in a special opening in the plastic casing 23.

Figure 6:
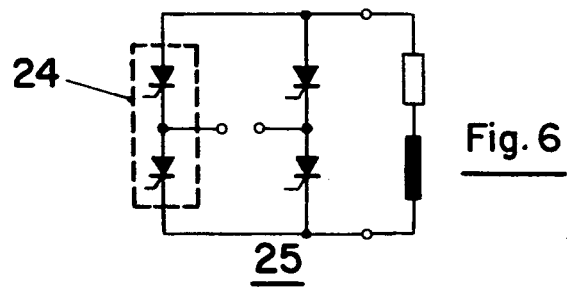

The semiconductor components fabricated by the method of the invention lend themselves particularly to incorporation in a modules integrated structure. Thus, for instance, two thyristors can be placed in one casing as described above and thus serve as the entire arm 24 (shown inside the dashed lines in FIG. 6) in a two-phase bridge circuit.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method of fabricating semiconductor high reverse voltage thyristors having electrodes and terminals, comprising the steps of:
   preparing an undivided semiconductor wafer having opposed sides and at least one pn-junction formed between said opposed sides,
   etching matching grid patterns of grooves into the opposed sides of said undivided wafer, said etching forming on said opposed sides matching mesas with concave side surfaces and opposed elevations with upper surfaces bounded by closed rounded curves, coating the exposed lateral surfaces of said mesas with a passivating layer, metallizing said upper surfaces of the said elevations, thereby providing ohmic contacts for said undivided semiconductor wafer, tinning with solder at least one side of a plurality of disks composed of electrically and thermally conducting material, locating the tinned disks with the tinned side thereof in contact wtih selected of the metallized upper surfaces of said elevations on the opposed sides of said undivided wafer, soldering simultaneously each of said disks to said selected elevations on opposed sides of said undivided wafer, and breaking said undivided semiconductor wafer into individual semiconductor chips along the lines of said etched grooves.

2. A method of fabricating semiconductor components according to claim 1 wherein said etching step further comprises:

forming elevations with circular upper surfaces on said undivided semiconductor wafer.

3. A method for fabricating semiconductor components according to claim 1 wherein said locating and soldering steps further comprise:

placing said disks on a template matching said grid pattern of said undivided wafer, laying one side of said wafer on said template, and soldering simultaneously said disks to said upper surfaces of said elevations in a plane parallel to the plane of said wafer.

4. A method of fabricating semiconductor devices according to claim 1, wherein said tinning, locating and soldering steps further comprise:

tinning with solder at least one side of a plurality of first disks composed of electrically thermally conductive material, placing said disks on a first template matching said grid pattern on one side of said undivided wafer, tinning with solder at least one side of a plurality of perforated second disks composed of electrically and thermally conductive material, laying said one side of said wafer on said first template, laying a second template matching said grid pattern on the other side of said wafer, placing said perforated second disks on said second template, and soldering simultaneously said disks and said perforated disks, respectively placed in said first and second templates to said upper surfaces of said elevations in planes parallel to the plane of said wafer.

5. A method for fabricating semiconductor components according to claim 4 wherein:

said first disks and said perforated second disks comprise molybdenum disks, and said soldering step uses a solder from the group consisting of lead-silver or lead-tin.

6. A method for fabricating semiconductor components according to claim 4 comprising the additional steps of:

measuring the inverse voltage rating of each semiconductor chip formed by said etched grooves before placing said first disks and said perforated second disks in said first and second templates respectively, detecting the locations of defective semiconductor chips, storing in a memory said locations of said defective semiconductor chips, and placing said first disks and said perforated second disks only in those locations of said first and second templates respectively which correspond to non-defective semi-conductor chips.

7. A method of fabricating semiconductor components according to claim 3 wherein said soldering step further comprises:

soldering control leads for said semiconductor components simultaneously with said soldering of said disks.

8. A method of fabricating semiconductor components according to claim 4 wherein said step of breaking said semiconductor wafer along said grooves is followed by the additional step of:

embedding the individual semiconductor chips formed by the breaking in plastic such that said disks on said one side and said perforated disks on said other side protrude through said plastic.

* * * * *